(12) United States Patent
Gonzalez

(10) Patent No.: US 6,798,013 B2
(45) Date of Patent: Sep. 28, 2004

(54) VERTICALLY INTEGRATED FLASH MEMORY CELL AND METHOD OF FABRICATING A VERTICALLY INTEGRATED FLASH MEMORY CELL

(76) Inventor: Fernando Gonzalez, 2579 S. Flotilla Ave., Boise, ID (US) 83706

( * ) Notice: Subject to any disclaimer, the term of this patent is extended or adjusted under 35 U.S.C. 154(b) by 0 days.

(21) Appl. No.: 10/229,824

(22) Filed: Aug. 28, 2002

(65) Prior Publication Data

US 2004/0041198 A1 Mar. 4, 2004

(51) Int. Cl.⁷ .......................................... H01L 29/788
(52) U.S. Cl. ................... 257/315; 257/298; 257/302; 257/316; 257/330; 257/334; 438/242; 438/259; 438/270; 438/271; 438/589
(58) Field of Search ................. 257/298, 302, 257/315–326, 330, 334; 423/242, 259, 270, 271, 589

(56) References Cited

U.S. PATENT DOCUMENTS

| 5,258,634 A | * | 11/1993 | Yang ........................... 257/316 |
| 5,312,768 A | * | 5/1994 | Gonzalez ..................... 438/227 |
| 5,608,279 A | | 3/1997 | Murray ........................ 257/306 |
| 5,693,971 A | | 12/1997 | González ..................... 257/314 |
| 5,753,947 A | | 5/1998 | González ..................... 257/296 |
| 5,831,276 A | | 11/1998 | González et al. ................ 257/3 |
| 5,841,150 A | | 11/1998 | González et al. .............. 257/3 |
| 5,854,102 A | | 12/1998 | González et al. ........... 438/237 |
| 5,863,819 A | | 1/1999 | González ..................... 438/238 |
| 5,912,840 A | | 6/1999 | González et al. ...... 365/185.05 |
| 5,981,367 A | | 11/1999 | González ..................... 438/593 |
| 6,005,273 A | | 12/1999 | González et al. ........... 257/366 |
| 6,090,693 A | | 7/2000 | González et al. ........... 438/592 |
| 6,096,596 A | | 8/2000 | González ..................... 438/239 |
| 6,118,135 A | | 9/2000 | González et al. ............... 257/3 |
| 6,171,964 B1 | | 1/2001 | González et al. ........... 483/694 |
| 6,178,113 B1 | | 1/2001 | Gonzalez et al. ...... 365/185.03 |
| 6,194,746 B1 | | 2/2001 | González et al. ........... 257/104 |
| 6,204,106 B1 | | 3/2001 | González ..................... 438/238 |
| 6,222,273 B1 | | 4/2001 | González et al. ........... 257/774 |
| 6,243,289 B1 | | 6/2001 | Gonzalez et al. ...... 365/185.03 |
| 6,255,689 B1 | * | 7/2001 | Lee ............................. 257/314 |
| 6,271,067 B1 | | 8/2001 | González et al. ........... 438/200 |
| 6,271,071 B1 | | 8/2001 | González ..................... 438/238 |
| 6,288,419 B1 | * | 9/2001 | Prall et al. .................. 257/213 |
| 6,300,188 B1 | | 10/2001 | González ..................... 438/239 |
| 6,307,238 B1 | | 10/2001 | González et al. ........... 257/402 |
| 6,323,088 B1 | | 11/2001 | González et al. ........... 438/257 |
| 6,420,786 B1 | | 7/2002 | González et al. ........... 257/774 |
| 6,429,070 B1 | | 8/2002 | González et al. ........... 438/253 |
| 6,429,449 B1 | | 8/2002 | Gonzalez et al. ............... 257/3 |
| 6,448,603 B2 | | 9/2002 | Gonzalez ..................... 257/306 |
| 6,479,880 B1 | | 11/2002 | Gonzalez ..................... 257/508 |
| 6,605,840 B1 | * | 8/2003 | Wu .............................. 257/315 |
| 2003/0155599 A1 | * | 8/2003 | Hsu et al. .................... 257/296 |

* cited by examiner

*Primary Examiner*—David Nelms
*Assistant Examiner*—Andy Huynh
(74) *Attorney, Agent, or Firm*—Fletcher Yoder

(57) ABSTRACT

A unique cell structure for use in flash memory cell and a method of fabricating the memory cell. More particularly, a vertically integrated transistor having a pair of floating gates is fabricated within a trench in a substrate. The floating gates are fabricated using sidewall spacers within the trench. A doped region is buried at the bottom of the trench. The structure can be fabricated such that the buried doped region provides a connecting layer in a multi-bit flash memory cell. Alternatively, the buried doped region may be used as a buried bitline in a single bit flash memory cell.

29 Claims, 11 Drawing Sheets

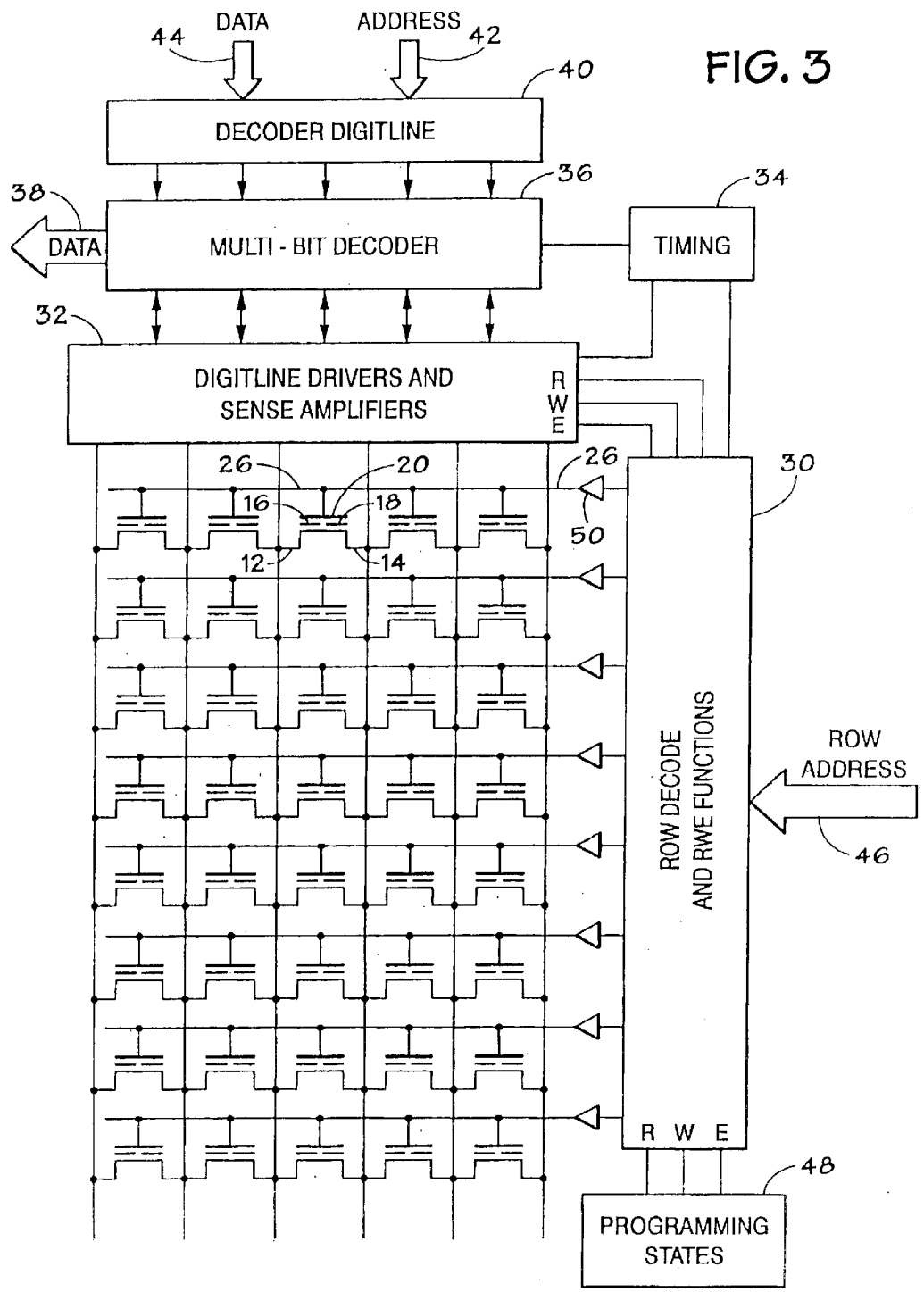

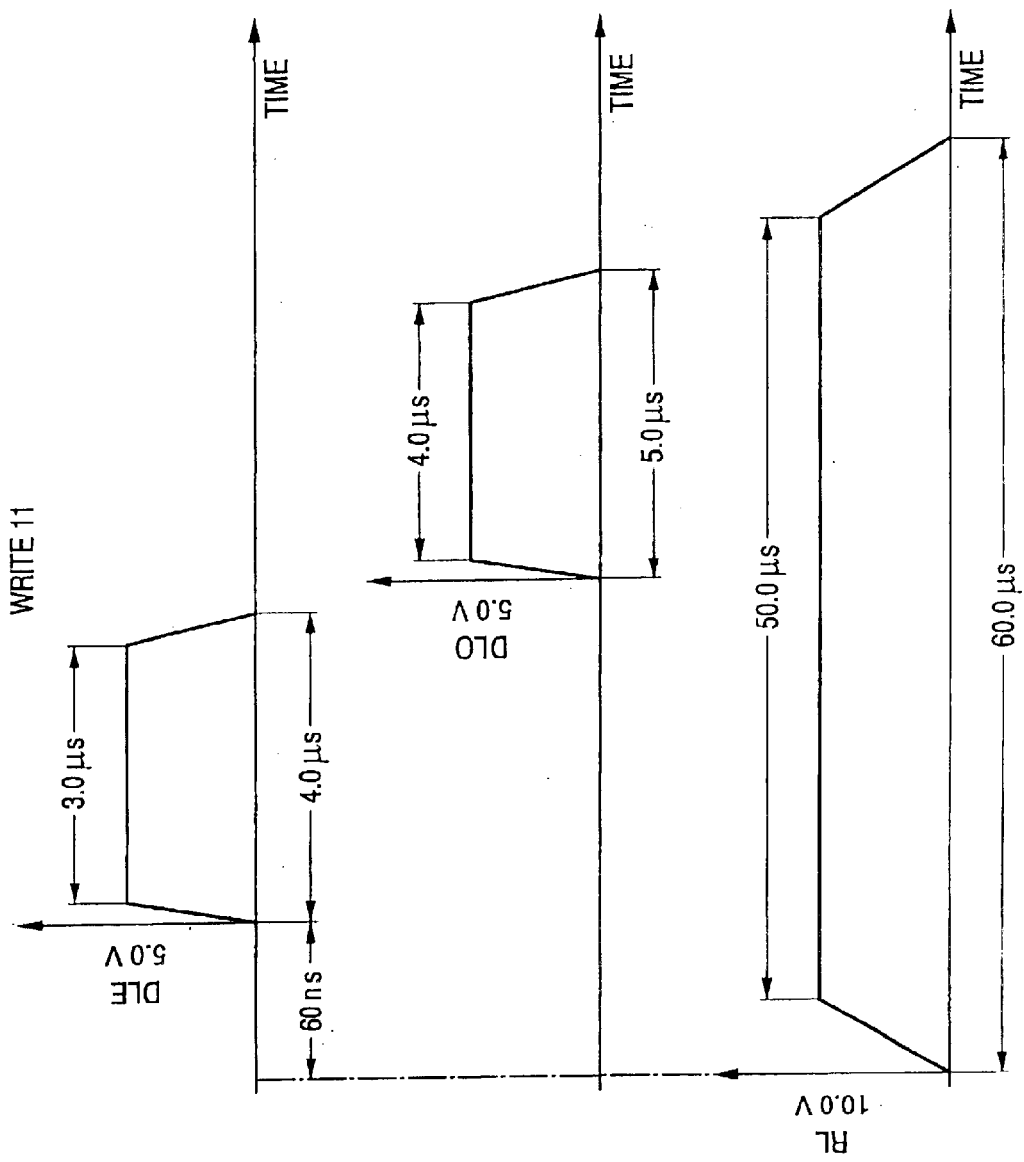

VERTICALLY INTEGRATED FLASH MEMORY CELL AND METHOD OF FABRICATING A VERTICALLY INTEGRATED FLASH MEMORY CELL

BACKGROUND OF THE INVENTION

1. Field of the Invention

The present invention relates generally to a unique cell structure for use in flash memory and, more particularly, to a vertically integrated flash memory cell which implements a pair of floating gates fabricated as sidewall spacers within a trench and to a method for fabricating the memory cell.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Electronic memory comes in a variety of forms and may be used for a variety of applications. One type of commonly used memory is flash memory. Flash memory is a solid state storage device which provides easy and fast information storage. Flash memory is a type of electrically erasable programmable read-only memory (EEPROM) that can be erased and programmed through exposure to an electrical charge. Flash memory allows data to be written or erased in blocks rather than one byte at a time as with typical EEPROM devices, thereby making flash memory considerably faster.

Flash memory generally includes a grid of columns and rows forming an array of flash memory cells. Each cell generally comprises two transistors separated by a thin oxide layer. One of the transistors serves as the floating gate while the other serves as the control gate. The floating gate is coupled to the row or wordline through the control gate. Single data bits or multiple data bits can be stored in the memory cells by placing various levels of charge on the floating gate of the cell transistor. By storing differing levels of charge and thus obtaining different levels of threshold voltage $V_t$, a cell can store more than one bit of information therein. For example, to facilitate the storage of two binary bits, four levels of charge and corresponding levels of $V_t$ may be used. During a read operation, a decoder senses the transition threshold $V_t$ to determine the corresponding binary value of the multi-bit information (e.g. 00, 01, 10, 11). Disadvantageously, storing higher densities of binary bits in each cell to increase the number of voltage levels $V_t$ used to store the higher bit densities introduces problems in the memory array including a higher operating voltage, more power dissipation, and increased circuit complexity for reading, erasing, and decoding the binary information. Further, if the number of charge levels increases without increasing the supply voltage, it becomes increasingly difficult to detect and distinguish the correct stored charge levels.

One technique for alleviating some of the problems associated with the storage of the multi-bit binary information in a memory cell is to provide two separate floating gates for each transistor within the memory cell. The control gate of the transistor is connected to a wordline provided over both floating gates while each of the source and drain regions of the transistor are connected to respective digit lines. Dual floating gate transistors distribute or partition the total charge in the transistor over each of the two floating gates, rather than a single floating gate. One advantage of dual floating gate transistors is that the dual floating gates allow for better control of the total charge in the transistor, as can be appreciated by those skilled in the art.

The processing of such structures is often costly and complex, especially with ever-increasing demands for smaller structures. Providing multi-bit flash cells and single bit flash cells incorporating dual floating gate patterns with less cumbersome and less costly processing techniques would be advantageous.

BRIEF DESCRIPTION OF THE DRAWINGS

Advantages of the invention may become apparent upon reading the following detailed description and upon reference to the drawings in which:

FIG. 3 illustrates an electrical schematic of an array of memory cells arranged in accordance with the present techniques;

FIGS. 5A, 5B, and 5C illustrate the timing diagrams for activating the digit lines and row line to write binary data "11" into the memory cell illustrated in FIGS. 1–3;

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
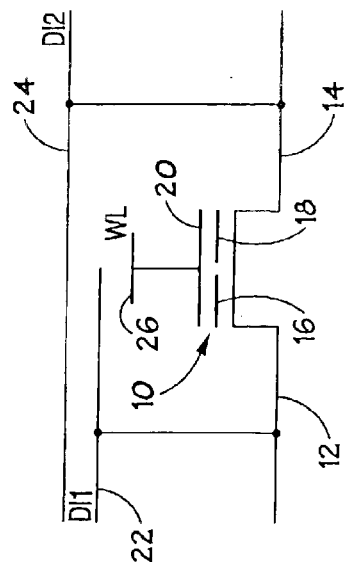
FIG. 1 illustrates the electrical schematic of a memory cell constructed in accordance with the present techniques.

FIG. 1 illustrates a memory cell constructed in accordance with the teachings of the present techniques. The memory cell is formed of a MOSFET transistor 10 having respective source and drain regions 12 and 14, a pair of floating gates 16 and 18, and a control gate 20 provided over both floating gates 16 and 18. The source 12 is respectively connected to a first digit (column/bit) line 22, and the drain 14 is respectively connected to a second digit line 24. The control gate 20 is connected to a row (word) line 26.

Figure 2:
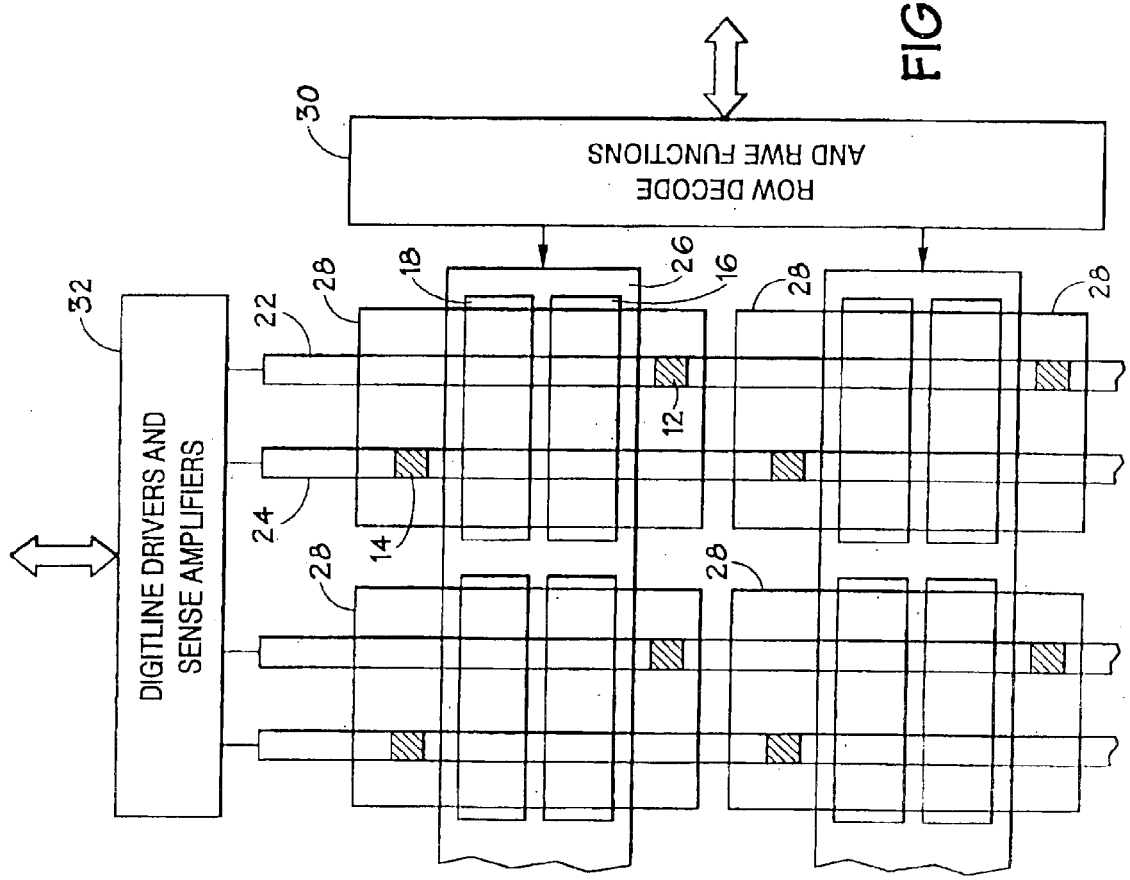
FIG. 2 illustrates a top view of the topology of the memory cell constructed in accordance with the present techniques.

The manner in which the transistor shown in FIG. 1 is integrated into a memory array is illustrated in FIGS. 2 and 3, where FIG. 2 illustrates the electrical connection of the FIG. 1 transistor 10 into a memory array and FIG. 3 illustrates in schematic form a top view of a portion of a silicon substrate containing a portion of the memory array.

FIG. 2 shows a memory cell 28 which contains the transistor 10 structure shown in FIG. 1. Row line 26 extends over respective floating gate regions 16 and 18. Digit lines 22 and 24, which are perpendicular to row line 26, are also illustrated as respectively extending over, and connecting with, source and drain regions 12 and 14. Each transistor is thus controlled by voltages applied to the row line 26 which covers both floating gates 16 and 18 and the respective digit lines 22 and 24 electrically connected to source and drain regions 12 and 14.

It should be noted that although the above description references region 12 as a source and region 14 as a drain, in fact, during the programming and readout operations, transistor 10 is operated so that each of regions 12 and 14 operate at one time or another as a source or a drain. Accordingly, for purposes of further discussion it should be recognized that whenever a region is identified as a source or a drain region, it is only for convenience. During operation of the transistor either region 12 or 14 could be a source or a drain depending on the manner in which the transistor is being controlled by voltages applied to the row line 26 and digit line 22 and 24 conductors.

FIG. 2 further illustrates, in block diagram format, a circuit 30. The circuit 30 forms part of an electric circuit which supplies the voltage control signals to the row conductor 26 during execution of a read, write, or erase operation. The row conductor 26 cooperates with digit lines 22 and 24, which are in turn activated by a digit line driver and sense amplifier circuit 32, which is also part of an electric circuit for supplying the voltage control signals to the digit lines 22, 24 during execution of a read, write or erase operation. The circuit 32 is connected to a timing block 34 that is run off a clock (not shown) as illustrated in FIG. 3.

The electrical schematic connection of a memory array having a plurality of cells 28 is illustrated in greater detail in FIG. 3. Each transistor in the array is shown in greater detail as is the connection to the row decoder and RWE circuit 30, the timing block 34, the odd (O) and even (E) digit lines 22, 24 and the digit line driver and sense amplifier circuit 32. The circuit 32 connected to a multi-bit decoder circuit 36. The function of decoder 36 is to decode the voltages which are sensed by the sense amplifiers in the circuit 32 on the odd and even digit lines 22 and 24 when a particular memory cell is read to thereby decode the value of the multi-bit information stored within the memory cell. The decoded multi-bit binary value (e.g. 00, 01, 10, 11 for a two-bit cell) is supplied out of the decoder block 36 as read data 38. The multi-bit decoder circuit 36 is also connected to a digit line decoder circuit 40 that decodes digit line addresses 42 for reading and writing information from and to a particular memory cell transistor 10. Digit line decoder circuit 40 also has a data input 44 that is used to program data into the memory cell transistor 10 as will be described in detail below. The row decoder also contains a row address input 46 as well as an RWE input from a programming state device 48, i.e. a memory controller, which determines which of the read, write, and erase memory operations is to be performed so that both the row decoder and RWE circuit 30 and digitline driver and sense amplifier circuit 32 are appropriately operated to execute either a read, write, or erase operation. The row decoder and RWE function circuit 30 is shown as connected to row lines 26 through respective driver amplifiers 50.

As noted earlier, the present technique utilize a pair of floating gates 16 and 18 in each memory cell transistor 10 to store charges representing the multi-bit binary data that is stored in each memory cell. For ease of subsequent discussion, assume that two binary bits of information are to be stored in each memory cell, i.e., one of the four states 00, 01, 10, and 11. In the following discussion, the voltages and timing signals are similar to the voltages and timing signals typically used in operation of a single floating gate transistor. Thus, the dual floating gate cell is able to store multi-bit binary data in a cell which operates in a manner which is similar to a conventional flash memory cell.

Figure 4A:
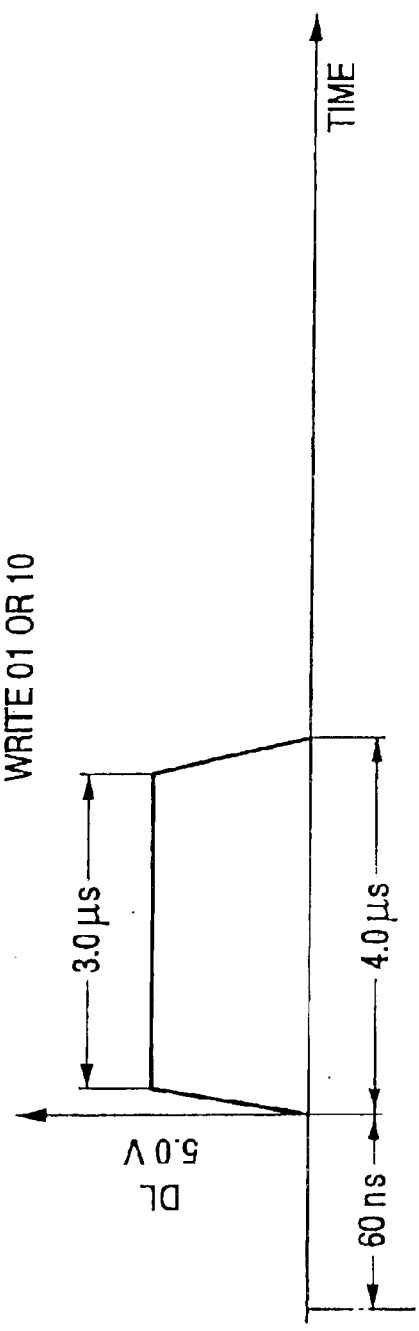
FIGS. 4A and 4B represent timing diagrams for activating the digit lines and row lines to write binary data "01" or "10" into the memory cell illustrated in FIGS. 1–3.
Figure 4B:
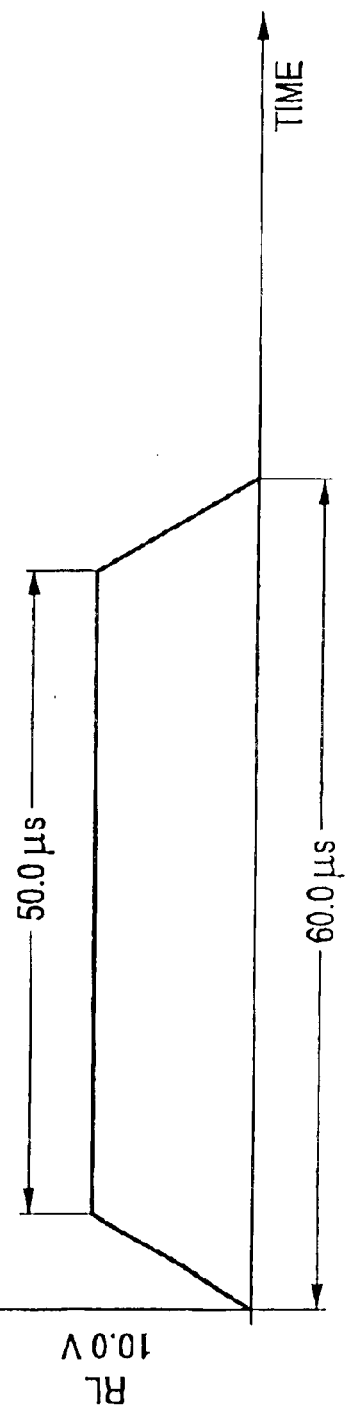

The programming of a memory cell to write a 01 or 10 state is illustrated in FIGS. 4A and 4B. The signal relationship is shown when FIGS. 4A and 4B are considered together. FIG. 4A represents the timing of a voltage which is applied to one of the digit lines (odd or even) by the digit line driver and sense amplifier circuit 32 depending on whether the incoming data 44 is to be stored as a 01 or 10 condition. As shown in FIG. 4A, a pulse having a duration in the range of 2 to 10 microseconds, such as approximately 4 microseconds ($\mu$s) duration, and at a level of approximately 5 volts, is applied to a digit line 22, 24 (again either odd or even depending on whether the programmed condition is 01 or 10) while at the same time, row line 26 has a pulse applied thereto of approximately 10 volts for a period in the range of 20–100 microseconds , such as approximately 60 microseconds ($\mu$s). As shown in FIGS. 4A and 4B, the row voltage is applied first, followed by the digitline voltage approximately 60 nanoseconds (ns) later. The overlapping voltages applied to the row line and digit line create a voltage differential across a floating gate to which the digit line corresponds causing the floating gate to store a charge.

FIGS. 5A, 5B, and 5C illustrate the timing diagrams for writing a 11 state into a memory cell transistor 10. As shown in FIG. 5A, the even digit line, e.g. digit line 24, has a pulse in the range of 2 to 10 microseconds, such as approximately 3 microseconds ($\mu$s) applied thereto, while at the same time the row line has approximately 10 volts applied thereto. The digit line 24 pulse occurs after the beginning of the row line pulse. This charges the floating gate associated with even digit line 24. After the digit line 24 is deactivated for approximately 60 ns, then the odd digit line 22 is activated for 2 to 10 microseconds, such as approximately 5 microseconds ($\mu$s). During this period, the row line 26 remains active throughout a period in the range of 20 to 100 microseconds such as approximately, 60 microseconds ($\mu$s). In this manner, both digit lines are activated in sequence while the row line is activated to cause the differential voltage between the row line and each digit line to store a charge in each of the floating gate regions 16 and 18.

Figures 6A, 6B, 6C:
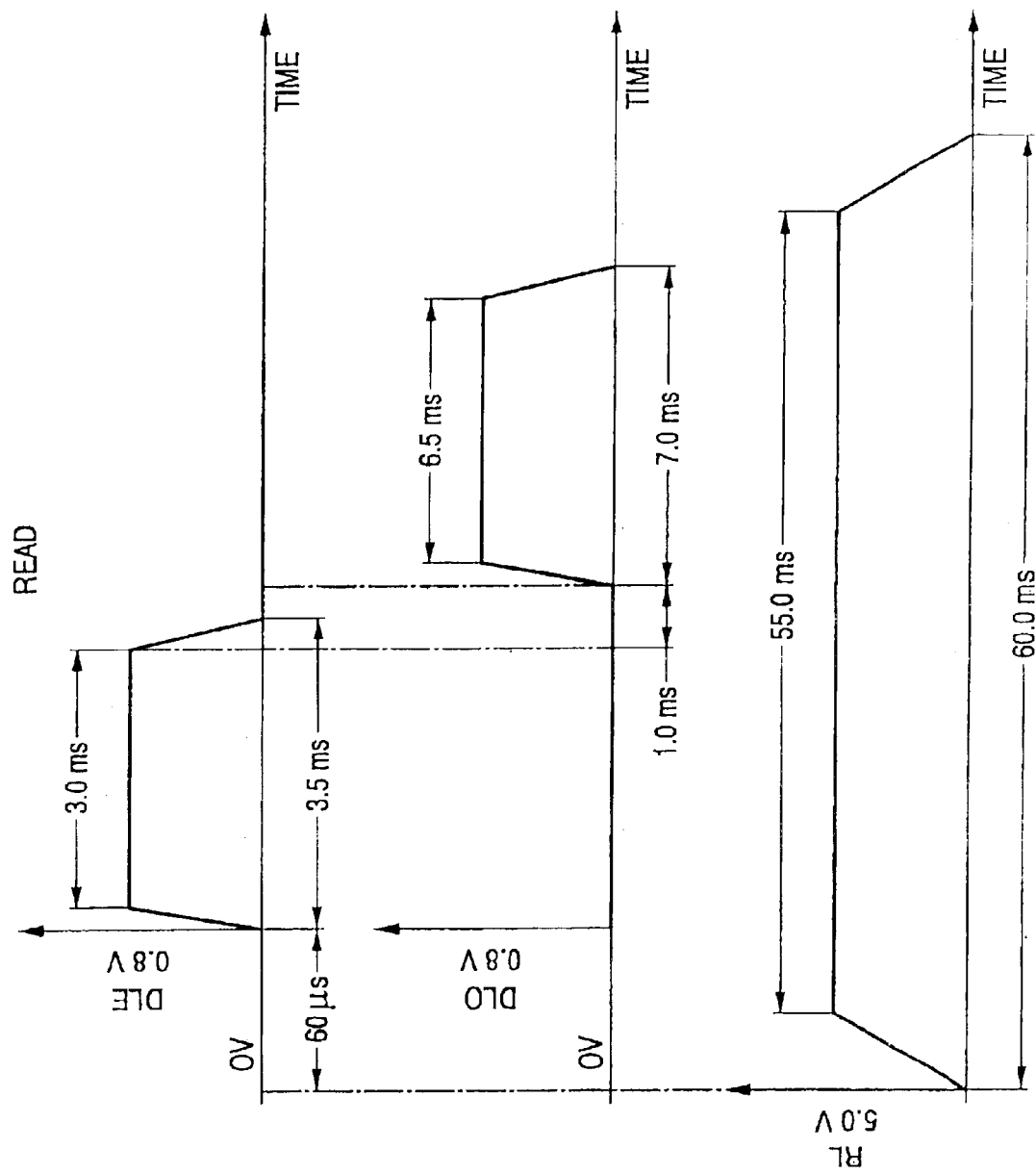
FIGS. 6A, 6B, and 6C illustrate the timing diagrams for activating the digit lines and row line to read a stored multi-bit binary value from the memory cell illustrated in FIGS. 1–3.

The manner in which stored charges can be read out from the transistor 10 is illustrated in FIGS. 6A, 6B and 6C. During a read operation, each of the digit lines is again activated, but this time, at a much lower voltage. As shown in FIGS. 6A and 6B, the digit lines have approximately 0.8 volt applied thereto. Again, this voltage is applied in sequence so that first the even digit line 24 has the voltage applied for a period in the range of 2 to 10 milliseconds (ms)

such as approximately 3.5 milliseconds, following which, the odd digit line 22 has the same voltage applied for a period in the range of 2 to 10 milliseconds such as approximately 3.5 milliseconds, so that in total, approximately 7 milliseconds are implemented for a read operation. During the entire time that the even and odd digit lines 24 and 22 are sequentially activated, the row line is activated with a higher voltage of approximately 5 volts for a period in the range of 20–100 milliseconds and such as approximately 60 milliseconds creating a differential voltage across the corresponding floating gates. This differential voltage between the row line 26 and each of the respective digit lines 22, 24 causes a read out through the sense amplifiers within the digitline driver and sense amplifier circuit 32 (FIG. 3) of a voltage value corresponding to the respective charges stored in each of the two floating gates 16 and 18 for each transistor 10. The output voltages from the respective even and odd digit lines are applied to the decoder 36 illustrated in FIG. 3 from the sense amplifiers. The decoder 36 takes the two voltages from the odd and even digit lines (22 and 24) and determines which of the states 00, 01, 10, or 11 was previously stored in the transistor 10. This data is then output via bus 38 from the decoder 36.

Each memory cell which is selected for either a write or read of data is addressed by the row decoder 30 and digit line decoder 40 in a conventional fashion. Accordingly, a detailed discussion of how row and digit address decoders operate will not be provided herein. Suffice it to say that when a digit line is addressed, there are two digit lines (odd and even) that are activated in sequence for a read operation and for writing the 11 state, while one or the other of the digit lines is activated for writing a 01 or 10 value into the memory cell.

Data is erased from transistor 10 by applying differential voltages across the row and digit lines in a manner which causes the charges stored within the floating gates to either tunnel to the digitlines or tunnel to the substrate. This restores the cell to a 00 state. In the case of the former, a voltage differential is applied by setting the row voltage to approximately zero volts while the digit lines are set at approximately 10 volts. By doing this, the electrons that are stored at the floating gate are attracted and tunnel to the digit line positive potential. Also, during the erase cycle, the digit lines alternate so that first the even 24 and then the odd 22 (or vice-versa) digit lines have the approximately 10 volts applied to them, while the row conductor (word line 26) remains at approximately zero volts. It is also possible to set the digit lines 22, 24 at a lower voltage, for example, 6 volts, while the word line 26 has approximately 4 volts applied to it. The differential voltage across the floating gate regions 16, 18 is still approximately 10 volts as before and erasure of the floating gate region charges will occur.

An alternative way to erase the memory cells is to have the electrons tunnel to the substrate from the two floating gates 16, 18. For this to occur, the erase can be accomplished by applying approximately 10 volts to the substrate while the word line 26 is set at approximately zero volts.

The timing diagrams described with reference to FIGS. 4A–4B, 5A–5C, and 6A–6C are further summarized in Table 1 below. Although representative voltages and timing patterns have been described for writing, reading, and erasing a memory cell, these are merely exemplary. Many changes and modifications can be made to produce, write, read, and erase signals which are equivalent to those described above and which can be used in an equivalent manner to operate the memory cell transistor 10 in the write, read and erase modes.

TABLE 1

| Programming State | Function | VDL even | VRL | VDL odd | DL Pulse duration | Leading Edge | RL Pulse Duration |
|---|---|---|---|---|---|---|---|
| "OO" | Read | .8 V/0 V | 5 V | 0 V/.8 V | 3 ms | 1st DLE leading edge is 60 us from RL leading edge and the 2nd DLO leading edge is .5 us from the 1st DLE trailing edge. RL trailing edge is 55 ms from the 2nd DLO trailing edge. | 60 ms |
|  | Write | 0 V | 0 V | 0 V | None | None | None |
|  | Erase* | 10 V | 0 V | 10 V | 50 ms by Blocks | Alternate the DL pulses | D.C. |
| "01" | Read | 0 V | 5 V | .8 V | 3 ms | 1st DLE leading edge is 60 us from RL leading edge and the 2nd DLO leading edge is .5 us from the 1st DLE trailing edge. RL trailing edge is 55 ms from the 2nd DLO trailing edge. | 60 ms |
|  | Write | float | 10 V | 5 V | 4 us | 60 ns after RL | 60 us |
|  | Erase* | 10 V | 0 V | 10 V | 50 ms by Blocks | Alternate the DL pulses | D.C. |
| "10" | Read | .8 V | 5 V | 0 V | 3 ms | 1st DLE leading edge is 60 us from RL leading edge and the 2nd DLO leading edge is | 60 ms |

TABLE 1-continued

| Programming State | Function | VDL even | VRL | VDL odd | DL Pulse duration | Leading Edge | RL Pulse Duration |
|---|---|---|---|---|---|---|---|
| | | | | | | .5 us from the 1st DLE trailing edge. RL trailing edge is 55 ms from the 2nd DLO trailing edge. | |
| | Write | 5 V | 10 V | float | 4 us | 60 ns after RL | 60 us |
| | Erase* | 10 V | 0 V | 10 V | 50 ms Blocks | Alternate the DL pulses | D.C. |
| "11" | Read | .8 V/0 V | 5 V | 0 V/.8 V | 3 ms | 1st DLE leading edge is 60 us from RL leading edge and the 2nd DLO leading edge is .5 us from the 1st DLE trailing edge. RL trailing edge is 55 ms from the 2nd DLO trailing edge. | 60 ms |
| | Write | 5 V | 10 V | 5 V | 4 us | 1st DL pulse 60 ns after RL leading edge and 2nd DL pulse 60 ns after 1st DL trailing edge | 60 us |
| | Erase* | 10 V | 0 V | 10 V | 50 ms by Blocks | Alternate the DL pulses | D.C. |

*Vsub = 10 V.

Techniques for fabricating transistor 10 having floating gates 16 and 18 will now be described with reference to FIGS. 7–17. A first fabrication technique of providing a multi-bit flash memory cell is described with reference to FIGS. 7–15, while a second fabrication technique of providing a single-bit memory cell is described with respect to FIGS. 16 and 17. Advantageously, the present techniques incorporate vertically integrated memory cell technology, as can be appreciated by those skilled in the art.

Figure 7:
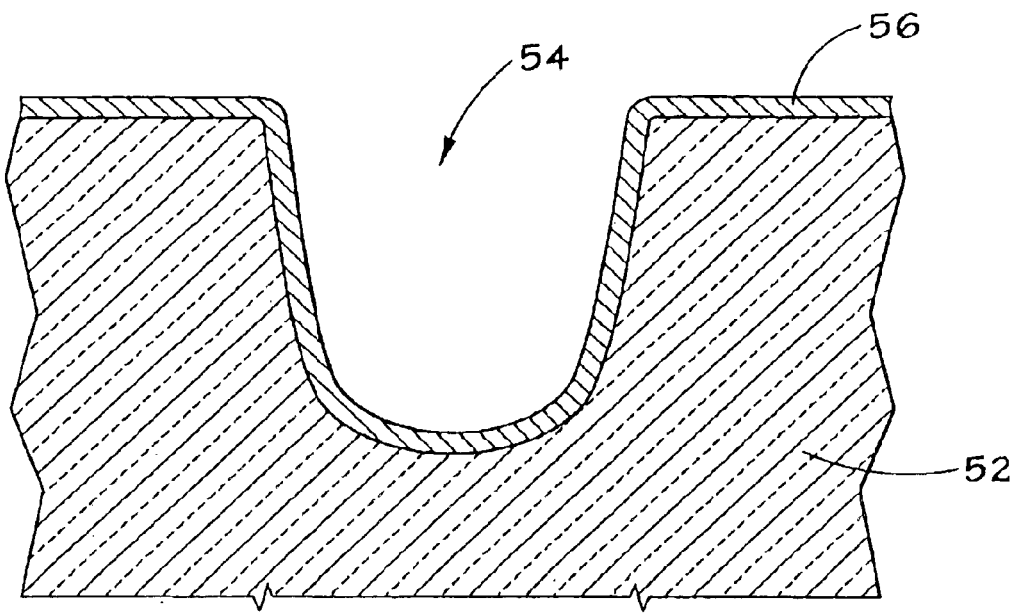
FIGS. 7–15 illustrate the steps for constructing a multi-bit memory cell in accordance with a first fabrication technique.

FIG. 7 illustrates a P-doped silicon (Si) substrate 52. The substrate 52 includes a U-shaped trench 54 in which the transistor 10 will be vertically fabricated. The trench 54 may be formed through any one of a number of commonly known wet or dry etching techniques such as plasma etching, ion beam etching, or reactive ion etching (RIE). The trenches may have a depth in the range of about 0.15 microns about 0.45 microns, for example. Advantageously, the trench 54 may be "U-shaped." By eliminating the hard edges that would exist in a more angular trench having sharp edges where the sidewalls of the trench intersect the floor of the trench, the threshold voltage of the device may be less affected by the trench shape. FIG. 7 also includes an oxide layer 56, such as silicon dioxide, which has been applied on top of the surface of the substrate 52 including the surface of the trench 54 by chemical vapor deposition (CVD), for example. It should be understood that those skilled in the art readily understand the deposition, masking, and etching techniques used to construct the structure illustrated in FIG. 7.

Figure 8:
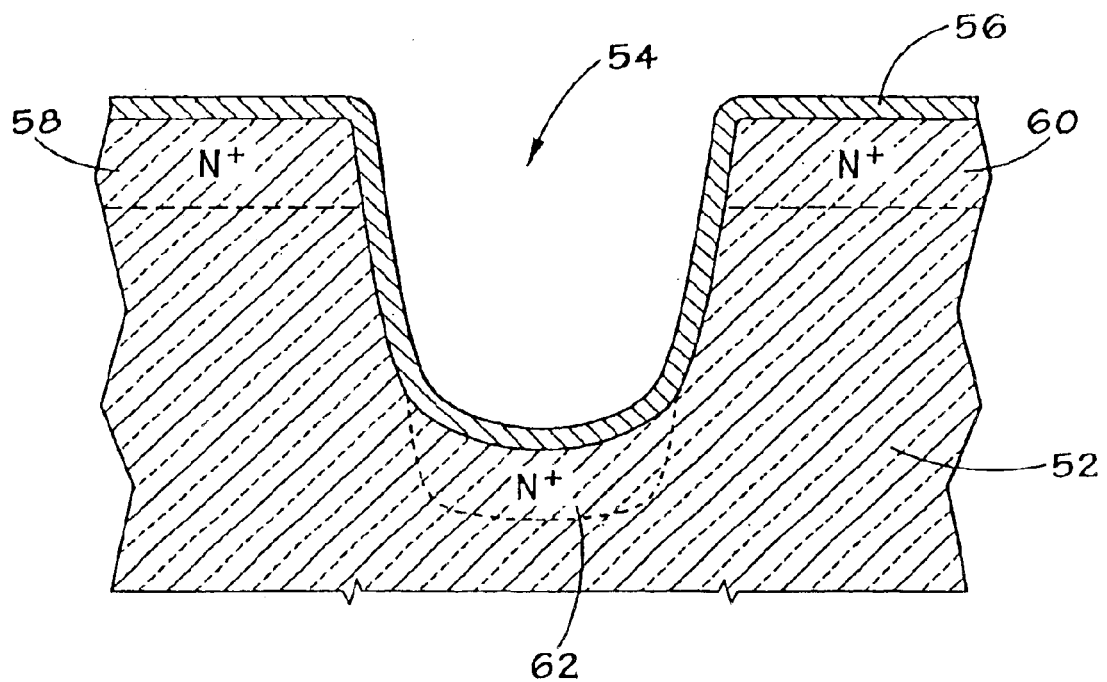

FIG. 8 illustrates the structure of FIG. 7 after the substrate 52 has been doped. Each of the N+ regions 58, 60 and 62 may be formed by a suitable doping technique, such as ion implantation, as can be appreciated by those skilled in the art. The N+ region 58 will eventually form the source 12 (or drain 14, depending on mode of operation) of the transistor 10. Similarly, the N+ region 60 will form the drain 14 of the transistor 10. The N+ region 62 may be implemented to reduce the effects of angled edges of a trench on the threshold voltage. However, as described above, because the trench 54 is U-shaped, the N+ contact region 62 may be omitted in the present exemplary embodiment. Alternatively, the buried N+ region 62 may be used as a buried digit or bit line if the transistor 10 is fabricated into a single-bit flash memory cell. Each of these options is discussed in greater detail below. Advantageously, the N+ regions 58, 60 and 62 are formed using a high-dosage of N+ dopents using low energy implantation, such as about about 500 eV, for example.

Figure 9:
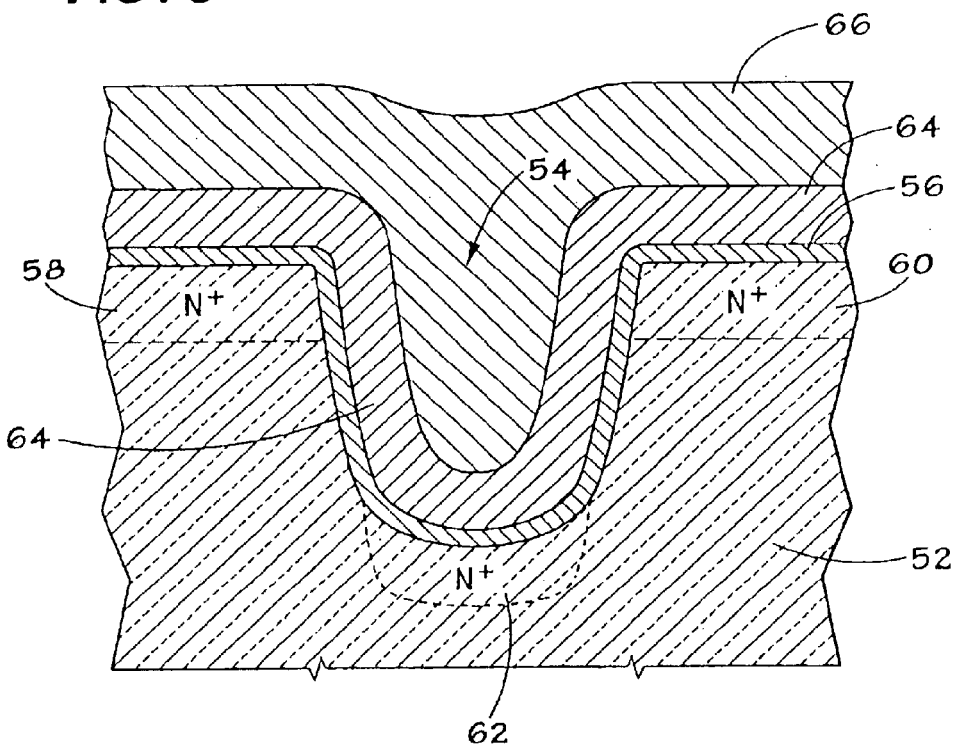

FIG. 9 illustrates the structure of FIG. 8 after the deposition of a polysilicon layer 64. A photoresist layer 66 is applied for the purpose of etching the polysilicon layer 64 to form polysilicon rows (illustrated in FIGS. 12–15). The polysilicon layer 64 is disposed through the trench 54 in a direction that will be ultimately perpendicular to the direction of the word line. As will be illustrated further with respect to FIGS. 12–15, the polysilicon layer 64 is patterned to provide a plurality of rows perpendicular to the word line. The photoresist layer 66 is patterned using a mask such that once the polysilicon layer 64 it etched, isolated rows are formed (FIGS. 12–15). After the rows are formed, the photoresist layer 66 may be removed via a chemical rinse, for example.

Figure 10:
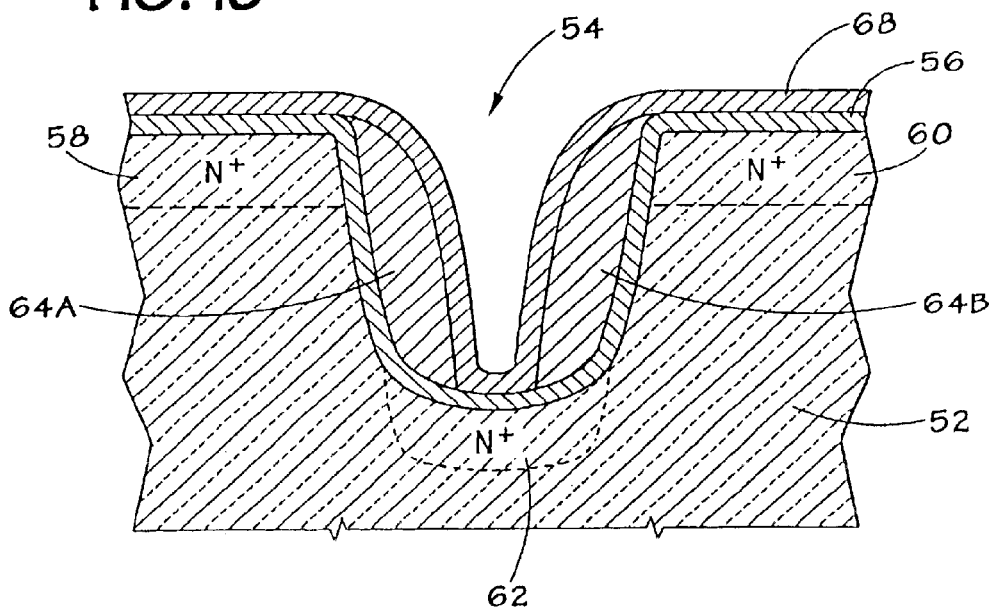

FIG. 10 illustrates the structure of FIG. 9 after formation of the rows and after the polysilicon layer 64 has been selectively etched to form sidewall spacers. In the present embodiment, the spacer etching process is selective to the oxide layer 56 such that the oxide layer 56 forms an etch-stop layer during the etching of the polysilicon layer 64. The polysilicon layer 64 is etched to form polysilicon spacers 64A and 64B. As previously described, the spacers 64A and 64B are electrically isolated from each other within the memory cell 28 (FIG. 2) thereby forming the floating gates 16 and 18 of the transistor 10.

Next, a gate oxide layer, such as an ONO (oxide, nitride, oxide) layer 68, is applied over the substrate 52. The ONO layer 68 forms the thin oxide layer between the control gate 20 (FIG. 1) and the floating gates 16, 18 used to enable the functionality of the transistor 10, as can be appreciated by those skilled in the art. As previously described and discussed further below, a word line will be formed on the ONO layer 68, thereby serving as the control gate 20 of the transistor 10.

Figure 11:
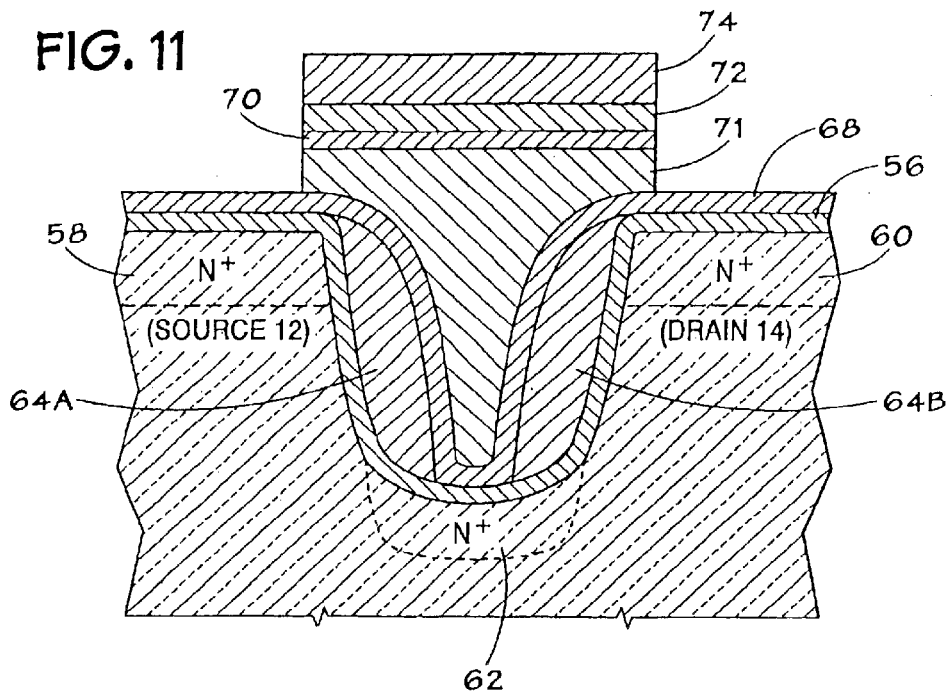

FIG. 11 illustrates the formation of the word line 26 (FIG. 1) in the trench 54. As previously described, the word line 26 provides the control gate 20 for the transistor 10. A doped polysilicon material 71 is disposed on top of the ONO layer 68 such that it fills the trench 54 entirely. The width of the word line 26 may be greater than the width of the trench. The surface of the polysilicon material 71 (word line 26) may then be planarized, such as by chemical mechanical polishing/planarization (CMP). After CMP, a metal layer, such as a tungsten (W) layer 72 may be disposed on the polysilicon material 71 (word line 26). The tungsten (W) layer 72, may be disposed by physical vapor deposition (PVD) or chemical vapor deposition (CVD), for example. Other suitable metals may be used in the metal layer, including, but not limited to copper, gold, tin, aluminum, nickel, titanium, and the like.

During fabrication of the memory cell, portions of the polysilicon material 71 may diffuse into the metal layer, here tungsten (W) layer 72, thereby reducing the conductivity of the polysilicon material 71. To prevent the diffusion of impurities from polysilicon layer 71 into the tungsten (W) layer 72, a barrier layer, such as tungsten nitride ($WN_x$) layer 70, may be disposed between the polysilicon material 71 and the tungsten (W) layer 72. While the tungsten nitride ($WN_x$) layer 70 electrically connects the tungsten (W) layer 72 to the polysilicon material 71, it also inhibits the diffusion of impurities from the polysilicon material 71 into the tungsten (W) layer 72 and protects the polysilicon material 71 during further processing, as can be appreciated by those skilled in the art. The tungsten nitride ($WN_x$) layer 70 may be deposited by physical vapor deposition (PVD) or by chemical vapor deposition (CVD), for example. As with the tungsten (W) layer 72, other suitable materials may be used for the barrier layer, including, but not limited to titanium nitride, for example. Further, the barrier layer may be omitted completely.

Finally, a nitride layer 74, such as silicon nitride ($Si_3N_4$) may be disposed on top of the tungsten layer 72 to prevent oxidation of the underlying metal layer during subsequent processing of the memory cell. As can be appreciated, various other common insulating materials such as silicon oxide ($SiO_2$), may be used instead of the nitride layer 74 or in combination with the nitride layer 74. The nitride layer 74 may be deposited by chemical vapor deposition (CVD), for example. Subsequently, conventional processing steps are applied to the structure of FIG. 11 to form the metal interconnect patterns using photoresist, alloying, passivation layers and bond pad pattern etching to complete the integrated circuit die, as can be appreciated by those skilled in the art.

Figure 12:
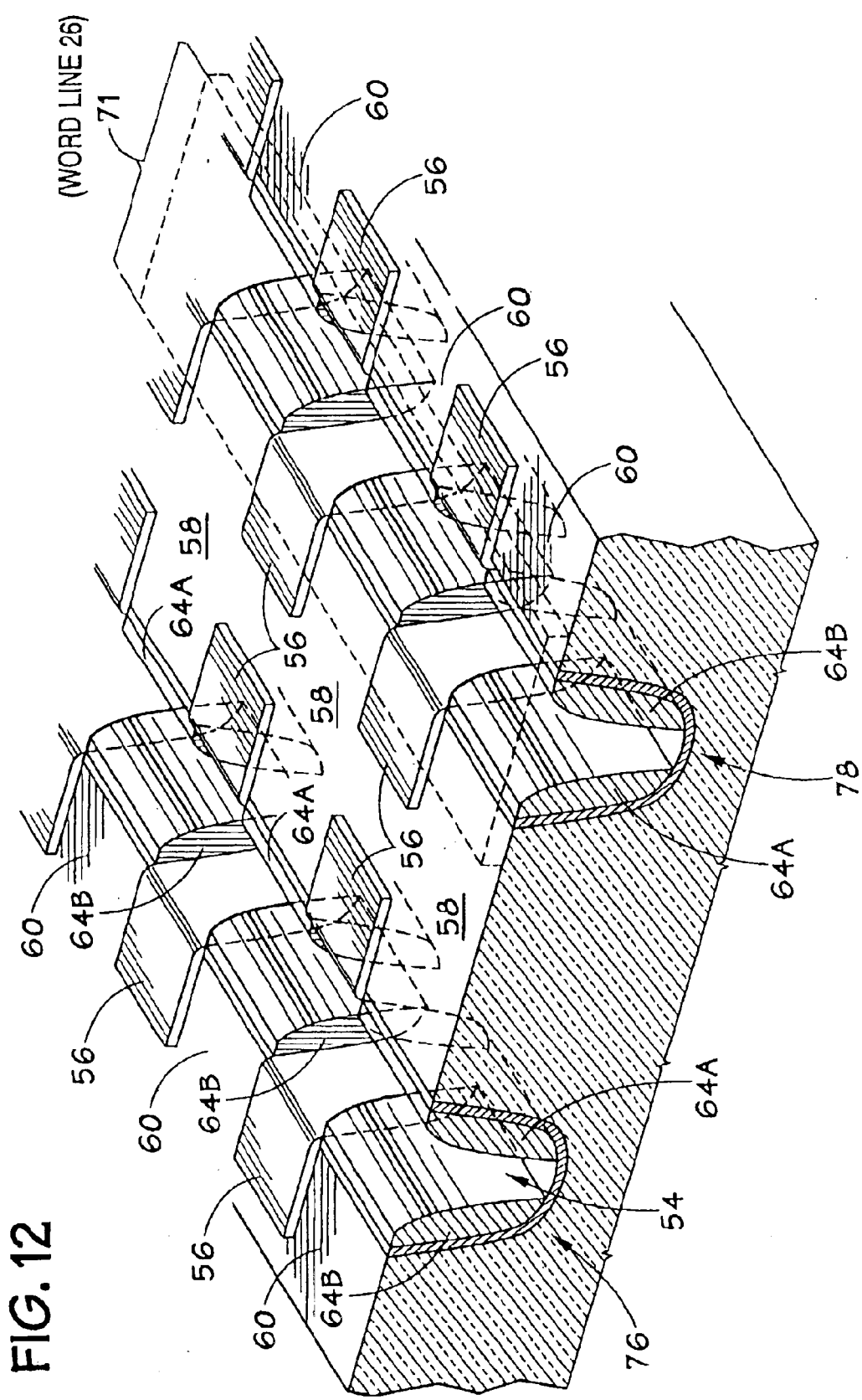

FIG. 12 is a partial cross-sectional plan view of a number of transistors 10 formed by the process described above. FIG. 12 is provided to illustrate better the rows and columns of the memory array described with reference to FIGS. 2 and 3. The row 76 is illustrated without a polysilicon word line 26 to illustrate better the trench 54 and the spacers 64A and 64B which form the floating gates 16 and 18 (FIG. 1) of the transistors 10, as previously described. The row 78 is illustrated with the polysilicon material 71 (word line 26). In the memory array, the transistors 10 share a common N+ region 58 or 60 with a transistor in the adjacent row. Here, the transistors 10 in row 76 and the transistors 10 in row 78 share a common N+ region illustrated here as a common source 12, for example. As can be appreciated, the other corresponding rows (not illustrated) directly adjacent to the rows 76 and 78 share respective common N+ regions 60. The N+ regions 58 and 60 provide the first digit line 22 and the second digit line 24, as previously described.

Figure 15:
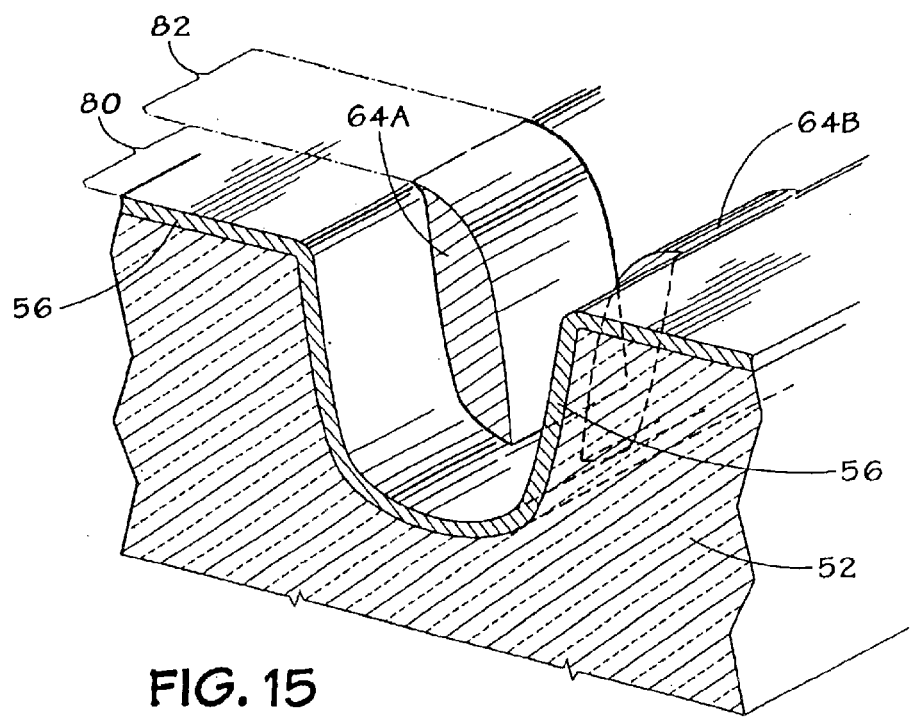
Figure 13:
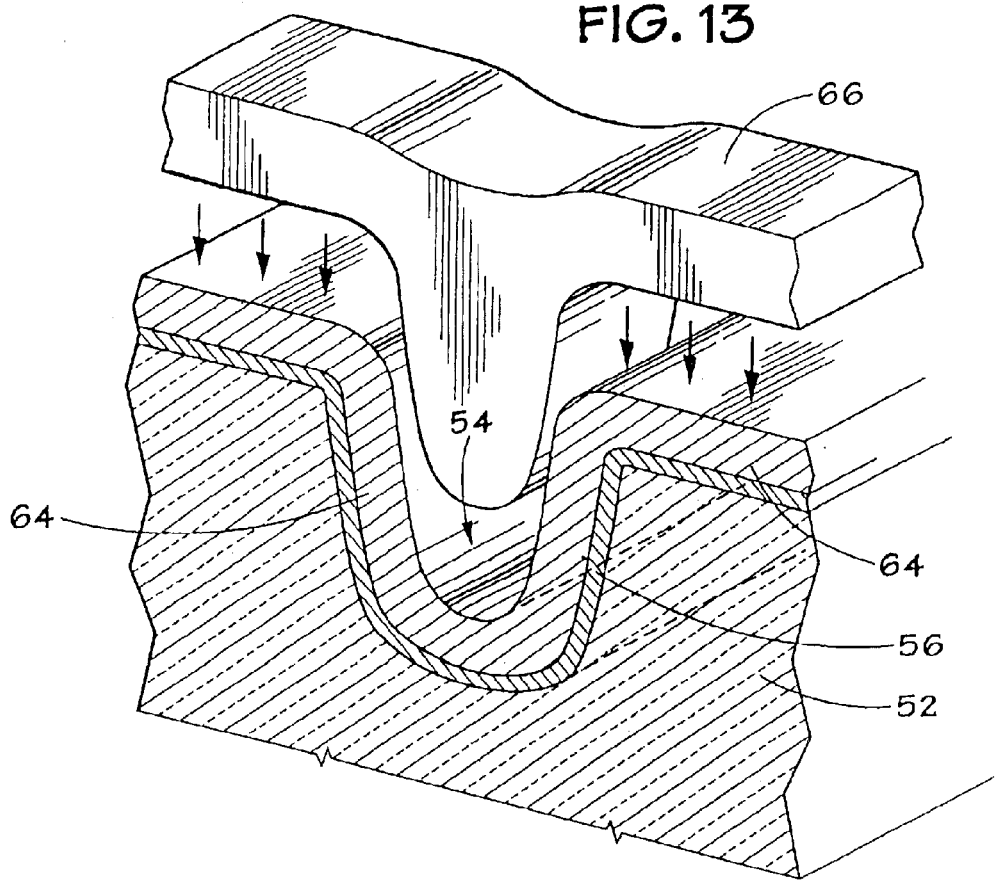
Figure 14:
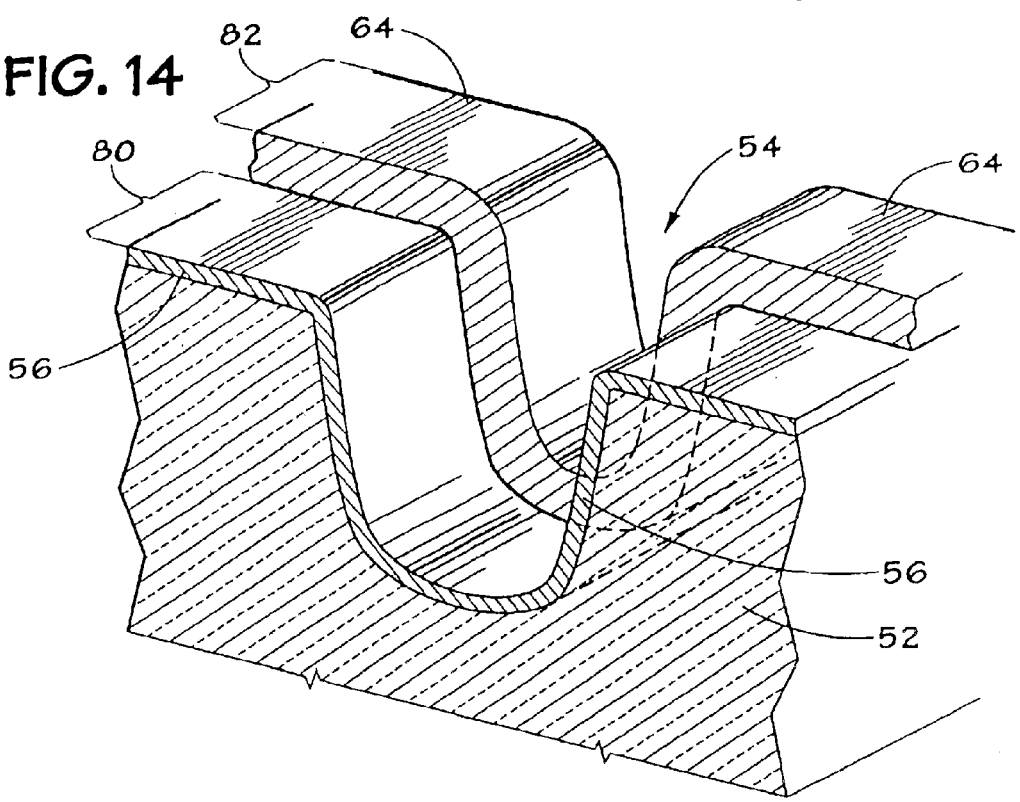

As illustrated with reference to FIG. 12, the dual floating gate transistors 10 are formed within the trenches 54. Each pair of polysilicon spacers 64A and 64B are separated by an oxide region wherein the polysilicon layer 64 was etched down to the oxide layer 56. FIGS. 13–15 illustrate an exemplary process of creating the polysilcon spacers 64A and 64B in accordance with the present technique. Specifically, FIGS. 13–15 illustrates a partial cross-sectional plan view of the substrate 52 taken along the cross-sectional line 13—13 of FIG. 12. As previously described, a trench 54 is formed in the substrate 52. The substrate 52 includes the oxide layer 56 and the polysilicon layer 64 which will be etched to form the spacers 64A and 64B. For simplicity, the doped N+ regions 58, 60 and 62 are not illustrated in FIGS. 13–15, although they may be present at this point in the processing, as previously described.

As previously described, the polysilicon layer 64 is etched using a photoresist layer 66 patterned to form the columns of the memory array by separating each of the transistors 10 in a respective row (e.g. each of the transistors 10 of row 76 or row 78 from adjacent transistors in the respective row). Thus, the photoresist 66 is applied across the substrate 52 in strips, as illustrated in FIG. 13. Once the patterned photoresist 66 is disposed on the surface of the polysilicon layer 64, it is exposed and developed to etch the underlying polysilicon layer 64, leaving the pattern illustrated in FIG. 14. As illustrated, the area 80 wherein the patterned photoresist layer 66 was disposed (FIG. 13) has been etched such that the polysilicon layer 64 has been removed, thereby leaving a layer of exposed oxide 56. The area 80 will eventually form the separation areas between the adjacent spacers in a row. Conversely, in the area 82 wherein the patterned photoresist layer 66 was not disposed on the polysilicon layer 64, the polysilicon layer 64 remains. The remaining polysilicon layer 64 is then etched (selective to the oxide layer 56) to provide the spacers 64A and 64B as previously described and further illustrated in FIG. 15. As can be appreciated by those skilled in the art, there are a number of techniques that may be used to form the dual floating gate multi-bit vertically integrated transistors 10 described herein.

Figure 16:
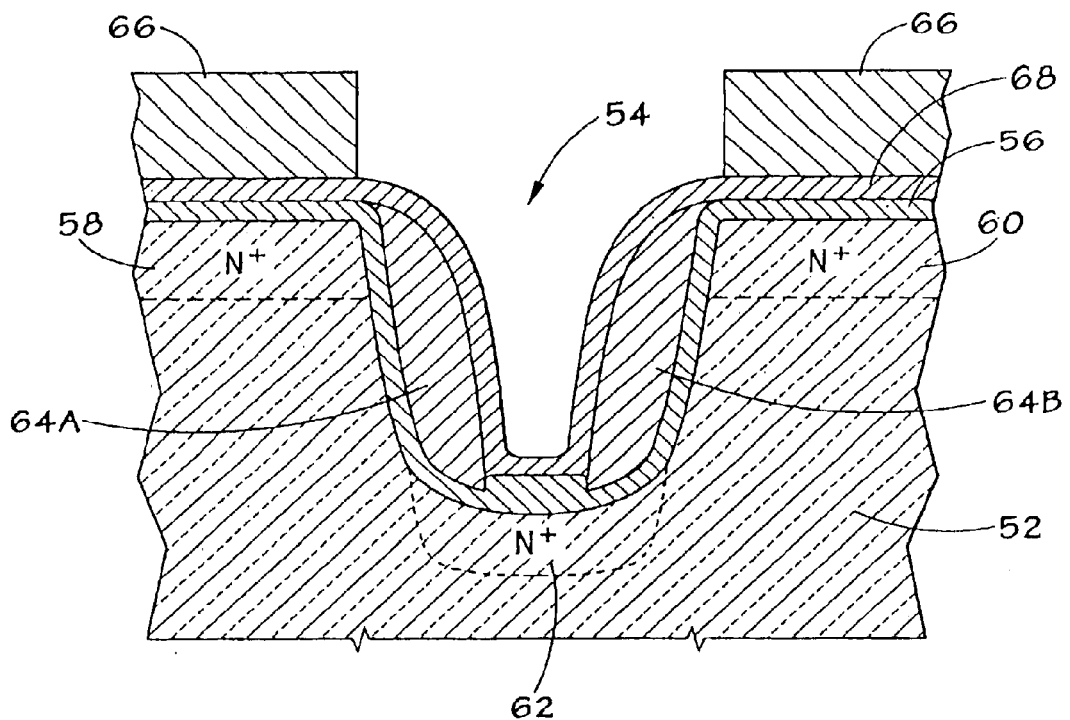
FIGS. 16 and 17 illustrate the steps for constructing a single-bit memory cell in accordance with a second fabrication technique.
Figure 17:
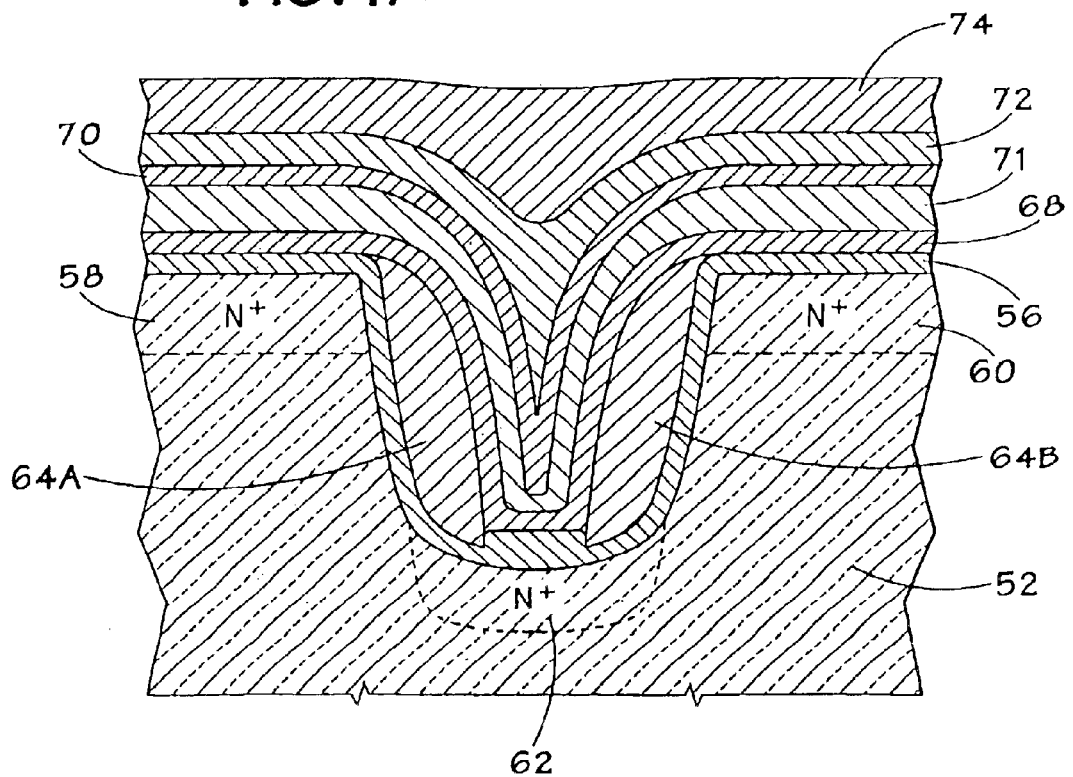

FIGS. 16 and 17 illustrate an alternate embodiment implementing the present techniques. The embodiment described with reference to FIGS. 16 and 17 illustrates a single bit flash memory cell incorporating a buried bit line. The structure illustrated with reference to FIG. 16 illustrates the same features discussed with reference to FIGS. 9 and 10. Accordingly, the substrate 52 includes a trench 54, an oxide layer 56, N+ regions 58, 60 and 62, polysilicon spacers 64A and 64B and an ONO layer 68. In the present exemplary embodiment, the N+ region 62 extends throughout the length of the trench 54. Conversely, the N+ contact regions 58 and 60 are isolated regions that are each adjacent to a respective sidewall spacer 64A and 64B.

During the etching of the polysilicon layer 64 to form the polysilicon spacers 64A and 64B, the oxide layer 56 may also be etched such that the oxide at the bottom of the trench 54 is depleted or completely removed. In one exemplary embodiment, the etchant used to etch the polysilicon layer 64 is not selective to oxide. Accordingly, the oxide layer 56 may be etched at the bottom of the trench 54, along with the polysilicon layer 64. After the formation of the polysilicon spacers 64A and 64B, the oxide layer 56 may be re-disposed such that it covers the bottom of the trench 54. The oxide layer 56 may be re-disposed at a greater thickness than originally disposed to provide better isolation between the wordline and the buried bitline formed by the N+ contact region 62. As illustrated in FIG. 16, the ONO layer 68 and the oxide layer 56 have been disposed through the trench 54 after the formation of the polysilicon spacers 64A and 64B.

As previously described with reference to FIG. 11, a doped polysilicon material 71 is disposed on top of the ONO layer 68 such that it fills the trench 54 entirely. However, because the polysilicon material 71 is now used to form a bitline, the polysilicon material 71 is not etched to extend through the entire length of the trench 54. Instead, the polysilicon material 71 will be etched to form rows which are isolated from adjacent rows formed down the length of the trench 54, as can be appreciated. As previously described, a metal layer, such as a tungsten (W) layer 72 may be disposed on the polysilicon material 71. To prevent the diffusion of impurities from the polysilicon material 71 into the tungsten (W) layer 72, a barrier layer, such as tungsten nitride ($WN_x$) layer 70, may be disposed between the polysilicon material 71 and the tungsten (W) layer 72, as previously described. Finally, a nitride layer 74, such as silicon nitride ($Si_3N_4$) may be disposed on top of the tungsten layer 72 to prevent oxidation of the underlying metal layer during subsequent processing of the memory cell. Subsequently, conventional processing steps are applied to the structure of FIG. 17 to form the metal interconnect patterns, as previously described with reference to FIG. 11. However, as previously discussed with reference to the polysilicon material 71 of the present embodiment, each of the wordline stack layers are etched to form isolated transistors down the length of the trench 54, as can be appreciated by those skilled in the art.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A memory cell having a vertically integrated transistor comprising:
   a substrate having a trench and comprising each of a first and second doped region located at the surface of the substrate and being coincident with the top of the trench;
   each of a first and second sidewall spacer disposed within the trench such that each of the first and second sidewall spacers is coincident to the bottom of the trench and one of the first and second doped regions;
   a first oxide layer disposed within the trench and arranged to provide a barrier between each of the spacers and each of the doped regions and such that a portion of the first oxide layer covers the bottom of the trench; and
   a second oxide layer disposed within the trench such that each of the first and second sidewall spacers and the portion of the first oxide layer covering the bottom of the trench is covered by the second oxide layer.

2. The memory cell, as set forth in claim 1, wherein the substrate comprises a silicon substrate.

3. The memory cell, as set forth in claim 1, wherein each of the first and second sidewall spacers comprise polysilicon.

4. The memory cell, as set forth in claim 1, wherein the first oxide layer comprises silicon dioxide.

5. The memory cell, as set forth in claim 1, comprising a wordline stack disposed within the trench.

6. The memory cell, as set forth in claim 1, wherein the second oxide layer comprises an oxide-nitride-oxide (ONO) layer.

7. The memory cell, as set forth in claim 1, wherein the wordline stack comprises a polysilicon layer disposed on the second oxide layer such that the trench is filled with the polysilicon layer.

8. The memory cell, as set forth in claim 7, wherein the wordline stack comprises a conductive layer disposed on the polysilicon layer.

9. The memory cell, as set forth in claim 8, wherein the conductive layer comprises a metal layer.

10. The memory cell, as set forth in claim 9, wherein the metal layer comprises tungsten.

11. The memory cell, as set forth in claim 9, wherein the conductive layer comprises a barrier layer disposed between the polysilicon layer and the metal layer and configured to reduce electron migration to the conductive layer.

12. The memory cell, as set forth in claim 11, wherein the barrier layer comprises a metal nitride.

13. The memory cell, as set forth in claim 12, wherein the barrier layer comprises tungsten nitride.

14. The memory cell, as set forth in claim 8, wherein the wordline stack comprises a nitride layer disposed on the conductive layer.

15. The memory cell, as set forth in claim 1, wherein the substrate comprises a third doped region located at the bottom of the trench.

16. The memory cell, as set forth in claim 15, wherein the third doped region extends through a length of the trench and is configured to form a bitline.

17. The memory cell, as set forth in claim 1, wherein the trench comprises a U-shaped trench.

18. A floating gate transistor comprising:
   a trench formed in a substrate, the trench comprising a first sidewall, a second sidewall and a bottom;
   a first floating gate comprising a first polysilicon spacer disposed along the first sidewall;
   a second floating gate comprising a second polysilicon spacer disposed along the second sidewall and being electrically isolated from the first polysilicon spacer;
   a control gate comprising a polysilicon wordline disposed on each of the first floating gate and the second floating gate in a direction perpendicular to each of the first and second polysilicon spacers;
   a first oxide layer disposed within the trench such that a portion of the first oxide layer covers the bottom of the trench and such that the first oxide layer is arranged between each of the first sidewall and the first polysilicon spacer and the second sidewall and the second polysilicon spacer; and a second oxide layer disposed within the trench such that each of the first and second polysilicon spacers and the portion of the first oxide layer covering the bottom of the trench is covered by the second oxide layer.

19. The floating gate transistor, as set forth in claim 18, wherein the second oxide layer comprises an oxide-nitride-oxide (ONO) layer.

20. The floating gate transistor, as set forth in claim 18, wherein the first oxide layer comprises silicon dioxide.

21. The floating gate transistor, as set forth in claim 18, wherein the substrate comprises:
   a first doped region coincident with each of the first sidewall of the trench and the first polysilicon spacer; and
   a second doped region coincident with each of the second sidewall of the trench and the second polysilicon spacer.

22. The floating gate transistor, as set forth in claim 21, wherein the substrate comprises a third doped region coincident with each of the bottom of the trench, the first polysilicon spacer and the second polysilicon spacer.

23. The floating gate transistor, as set forth in claim 18, comprising a conductive layer disposed on the polysilicon wordline.

24. The floating gate transistor, as set forth in claim 23, wherein the conductive layer comprises a metal layer.

25. The floating gate transistor, as set forth in claim 24, wherein the metal layer comprises tungsten.

26. The floating gate transistor, as set forth in claim 24, wherein the conductive layer comprises a barrier layer disposed between the polysilicon wordline and the metal layer and configured to reduce electron migration to the polysilicon wordline.

27. The floating gate transistor, as set forth in claim 26, wherein the barrier layer comprises a metal nitride.

28. The floating gate transistor, as set forth in claim 26, wherein the barrier layer comprises tungsten nitride.

29. The floating gate transistor, as set forth in claim 23, comprising a nitride layer disposed on the conductive layer.

* * * * *